United States Patent
Guyaguler et al.

(10) Patent No.: US 8,463,457 B2
(45) Date of Patent: Jun. 11, 2013

(54) FEEDBACK CONTROL USING A SIMULATOR OF A SUBTERRANEAN STRUCTURE

(75) Inventors: Baris Guyaguler, Aberdeen (GB); Andreas Theodoros Papadopoulos, Oxfordshire (GB); Jonathan Anthony Holmes, Reading (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 500 days.

(21) Appl. No.: 12/473,310

(22) Filed: May 28, 2009

(65) Prior Publication Data
US 2009/0312996 A1    Dec. 17, 2009

Related U.S. Application Data

(60) Provisional application No. 61/061,540, filed on Jun. 13, 2008.

(51) Int. Cl.
*G06F 17/50* (2006.01)

(52) U.S. Cl.
USPC .......... 701/1; 703/10; 702/6; 700/40

(58) Field of Classification Search
USPC .............. 703/1, 10; 702/6; 700/40
See application file for complete search history.

(56) References Cited

U.S. PATENT DOCUMENTS

| | | | | |
|---|---|---|---|---|
| 6,106,561 | A | * | 8/2000 | Farmer .......................... 703/10 |
| 6,701,236 | B2 | * | 3/2004 | Ulyanov et al. .................. 703/1 |
| 7,561,997 | B1 | * | 7/2009 | Miller ............................. 703/10 |
| 7,809,538 | B2 | * | 10/2010 | Thomas ......................... 703/10 |
| 2007/0168170 | A1 | | 7/2007 | Thomas |

FOREIGN PATENT DOCUMENTS

| | | |
|---|---|---|
| GB | 2326747 A | 12/1998 |
| GB | 2355767 A | 6/2000 |
| WO | 2008157706 A2 | 12/2008 |

OTHER PUBLICATIONS

WO2008054610.*
Guyaguler, B. et. al., "Feedback Controllers for the Simulation of Field Processes", SPE 118969, 2009, pp. 1-18.

* cited by examiner

*Primary Examiner* — Eunhee Kim
(74) *Attorney, Agent, or Firm* — Lam Nguyen; Rodney Warfford

(57) ABSTRACT

To provide feedback control in a simulation framework, any one of plural output metrics from a simulator of a subterranean structure is selected. A value for the selected output metric is received from the simulator. In response to the received value of the selected output metric and a target value of the selected output metric, at least one setting of the simulator is adjusted by a feedback controller.

15 Claims, 6 Drawing Sheets

FEEDBACK CONTROL USING A SIMULATOR OF A SUBTERRANEAN STRUCTURE

CROSS-REFERENCE TO RELATED APPLICATIONS

This claims the benefit under 35 U.S.C. §119(e) of U.S. Provisional Application Ser. No. 61/061,540, entitled "SYSTEM AND METHOD FOR CONTROLLING OILFIELD RESERVOIR FLOW ENTITIES USING FEEDBACK CONTROLLERS," filed Jun. 13, 2008, which is hereby incorporated by reference.

BACKGROUND

There are generally three phases that are undertaken to obtain hydrocarbons or other fluids from a given field of development (or from a well). The phases are exploration, appraisal and production. During exploration, one or more subterranean structures (e.g., formations or reservoirs) are identified that may include fluids in an economic quantity.

Following successful exploration, the appraisal phase is conducted. During the appraisal phase, operations, such as drilling wells, are performed to determine the size of the field and how to develop the field. After the appraisal phase is complete, the production phase is initiated. During the production phase, fluids are produced from reservoirs in the field.

In one or more of the phases discussed above, simulation of subterranean structures (e.g., reservoirs) can be performed by using models of such subterranean structures. Performing simulations using models of subterranean structures can assist operators in better understanding the subterranean structures such that more effective strategies can be developed to produce fluids such as hydrocarbons from the field.

However, conventional techniques of performing simulations may not offer the accuracy or flexibility that may be desired.

SUMMARY

In general, feedback control in performing simulation of a subterranean structure is provided. Any one of plural output metrics from a simulator of the subterranean structure is selected. A value for the selected output metric is received from the simulator. In response to the received value of the selected output metric and a target value of the selected output metric, at least one setting of the simulator is adjusted by a feedback controller.

Other or alternative features will become apparent from the following description, from the drawings, and from the claims.

DETAILED DESCRIPTION

In the following description, numerous details are set forth to provide an understanding of the present disclosure. However, it will be understood by those skilled in the art that some embodiments may be practiced without these details and that numerous variations or modifications from the described embodiments are possible.

In accordance with some embodiments, a control system with a feedback controller is used in a simulation framework that provides a numerical simulator of a subterranean structure, such as a reservoir, formation or other structure underneath an earth surface. The feedback controller used according to some embodiments can be either a Proportional Integral Derivative (PID) feedback controller or a fuzzy logic feedback controller. A PID feedback controller and fuzzy logic feedback controller are discussed further below.

Using such feedback controller allows for provision of generic feedback control where any observable metric from a simulator (of a subterranean structure) can be coupled to any controllable variable that is an input to the simulator. More generally, a control system that includes the feedback controller and simulator of a subterranean structure is able to select any one or more observable metrics (from multiple possible observable metrics) output from the simulator to couple to any of one or more controllable variables (from among multiple possible controllable variables) that are input to the simulator. The selectivity of the output observable metric and the input controllable variable can be based on predetermined input, such as user selection and/or predefined criteria. This generic any-to-any feedback control in a simulation framework allows for greater flexibility.

Using feedback control in a simulation framework for subterranean structures can help an operator perform one or more of the following: maintain desired operating conditions in a field; formulate a better plan or strategy for development of a field; or provide a better design of a system (e.g., an automated system) used to produce hydrocarbons or other fluids from the field. For example, operating strategies can be developed, and/or feasibility of installing physical control devices in the field can be determined. More generally, providing feedback control in a simulation framework for simulation of subterranean structures assists operators in better understanding a particular field (or well) that is to be developed.

Figure 1:
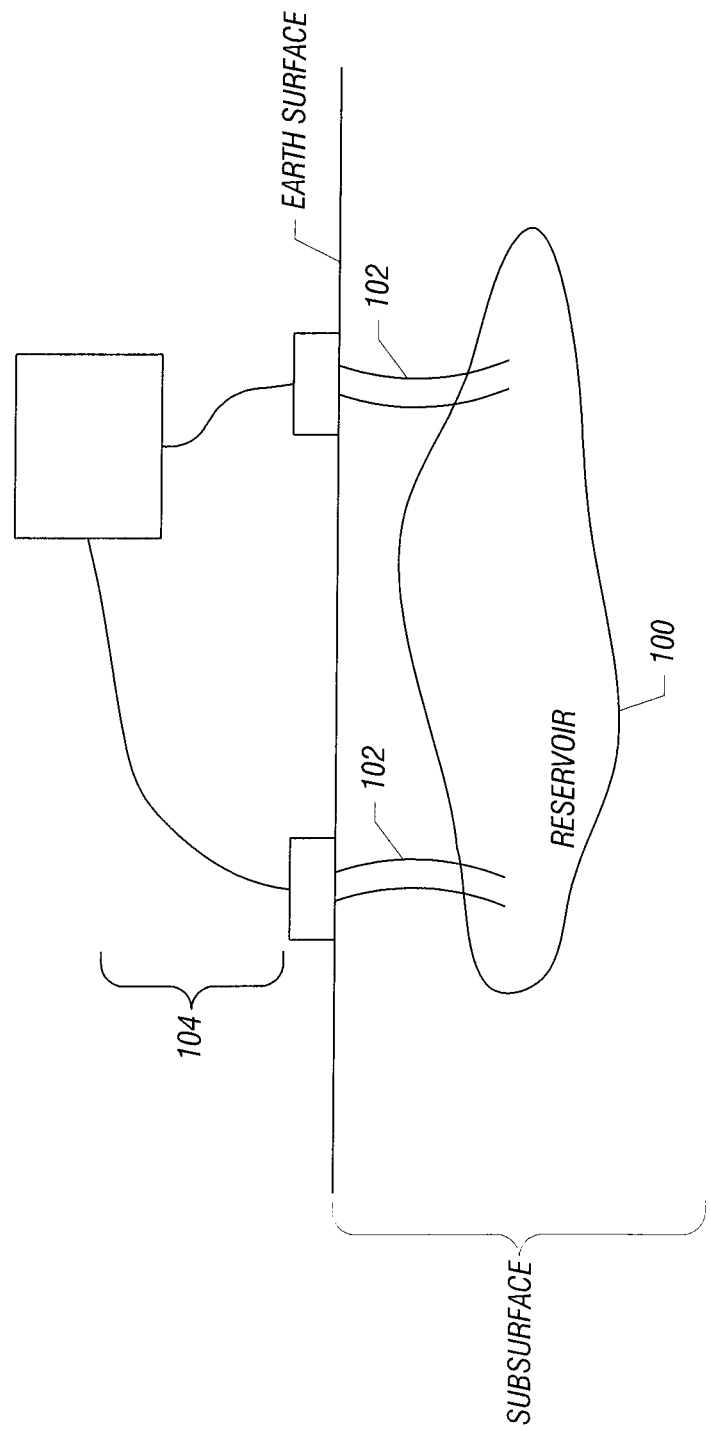
FIG. 1 is a schematic diagram of an exemplary arrangement that includes a subterranean structure that can be simulated using a simulation framework with feedback control, according to an embodiment.

FIG. 1 illustrates an exemplary arrangement for extracting fluids from a reservoir 100 in the subsurface. Wellbores 102 have been drilled into the subsurface to intersect the reservoir 100. Although not shown, completion equipment can be provided in the wellbores 102 to assist in producing fluids from the reservoir 100 to the earth surface. Surface equipment 104 is deployed to allow for extraction of the fluids and to carry the extracted fluids to target locations. The arrangement of FIG. 1 can be a land-based arrangement or a marine arrangement (in which the reservoir 100 is located underneath a sea floor or other water bottom surface.

Figure 2:
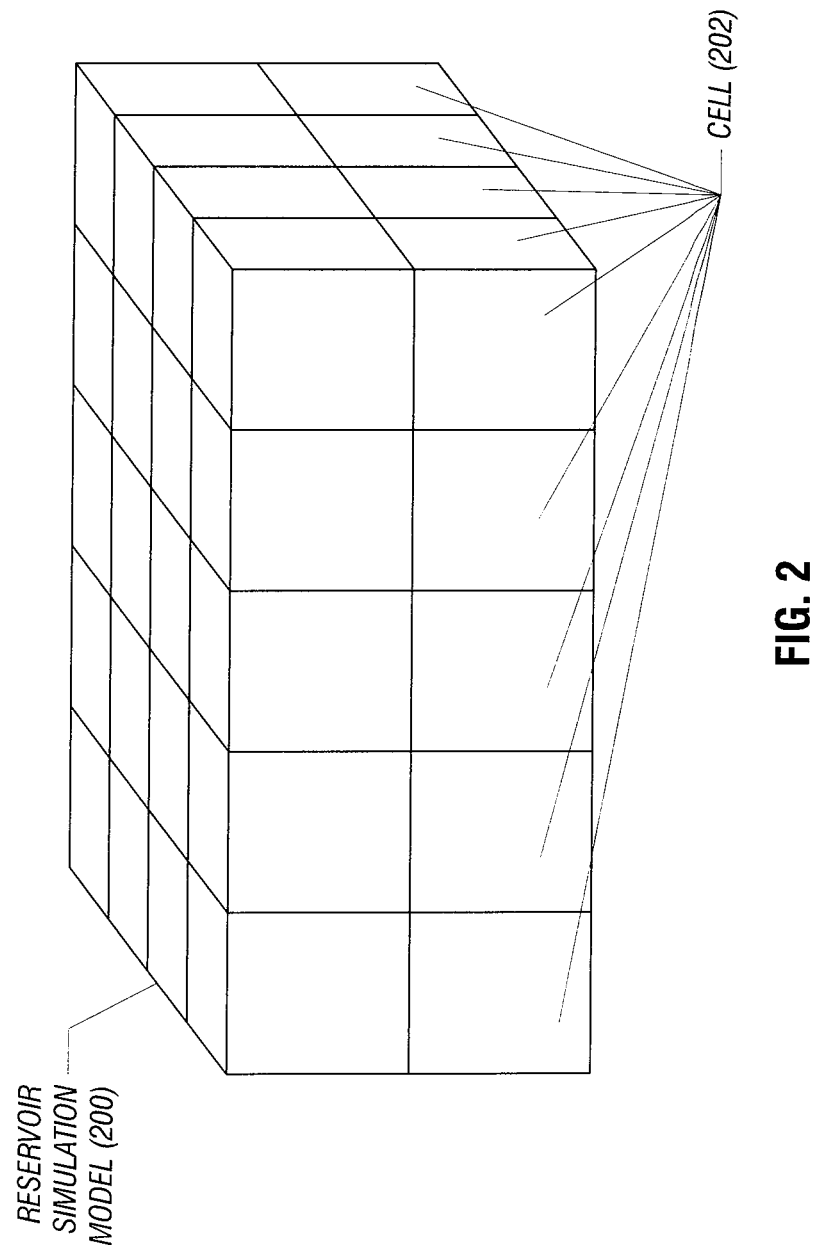
FIG. 2 illustrates an exemplary model of a subterranean structure that can be used by a simulator used in the simulation framework according to an embodiment.

The reservoir 100 can be modeled by using a reservoir simulation model. The reservoir simulation model is used by a simulator to perform simulations, which produces output values for one or more metrics based on input data values. As shown in FIG. 2, a reservoir simulation model 200 can be a three-dimensional (3D) model, which has a grid to partition the simulated reservoir into multiple cells 202. Each cell 202 represents a portion of the reservoir and is characterized by the physical properties of the portion of the reservoir (e.g., temperature, pressure, phase saturations, oil viscosity, porosity, permeability, etc.). Instead of a 3D model, a two-dimensional (2D) model or even a one-dimensional (1D) model can be used instead. As yet another alternative, the model can be a time-lapse model that considers a time dimension—for example, the time-lapse model can be a 4D model.

Figure 3:
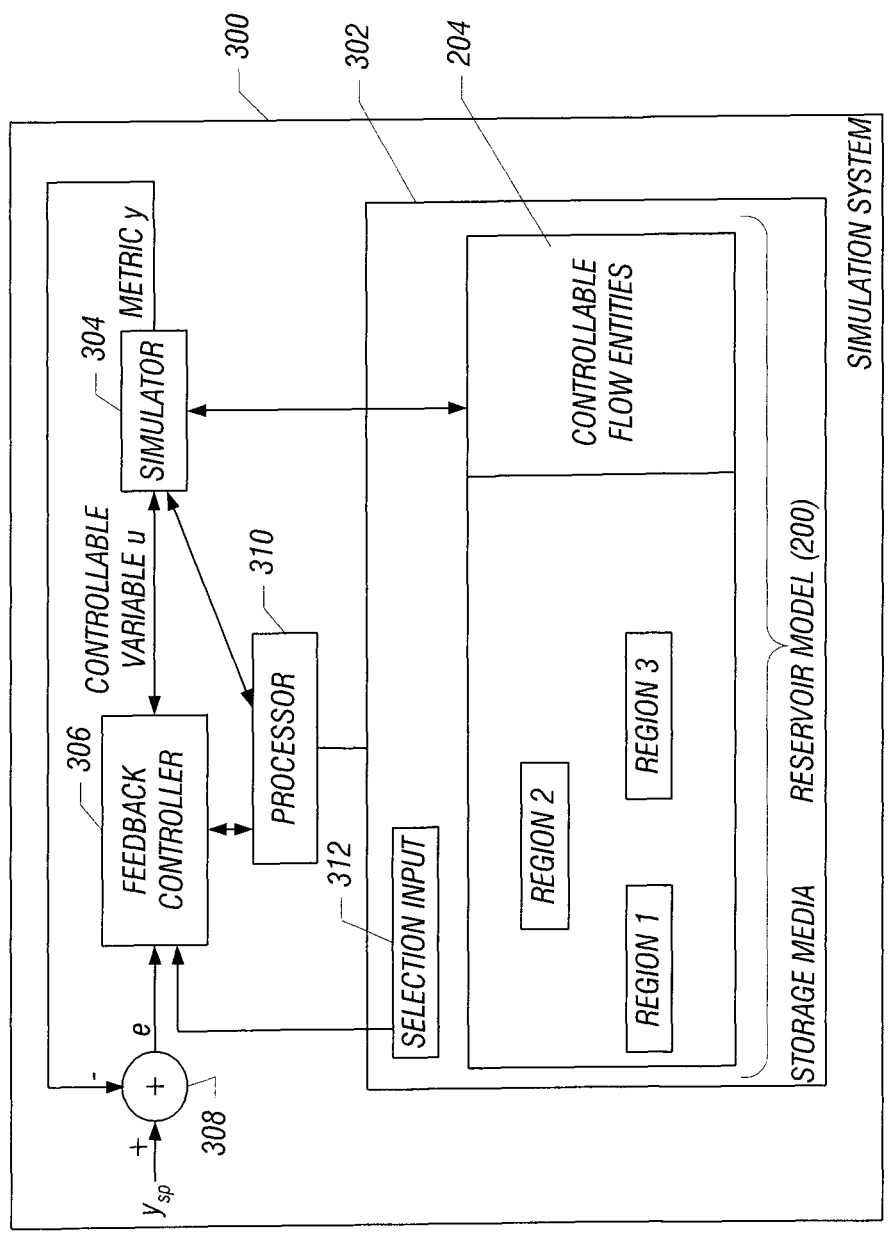
FIG. 3 is a block diagram of a system that includes a simulator and a feedback controller, according to an embodiment.

FIG. 3 shows a simulation system 300 that is able to use the model 200 of FIG. 2 (1D, 2D, 3D, or time-lapse model). The simulation system 300 includes a simulator 304 that performs simulation of a reservoir using the reservoir model 200. The simulation system 300 further includes a feedback controller 306, which can be a PID feedback controller or a fuzzy logic feedback controller, in accordance with some embodiments. The simulator 304 and feedback controller 306 can be software modules executable on a processor 310, which can include one CPU (central processing unit) or multiple CPUs (whether run on one computer or multiple computers). The simulation system 300 can be implemented with one or multiple computers, for example.

An output of the simulator 304 includes an output metric y, which is fed back to a comparator 308. The comparator 308 also receives a target (predefined) value of the metric, $y_{sp}$, and compares y to $y_{sp}$ to produce a comparison value e (which represents the difference between y and $y_{sp}$). The comparison value e is provided to an input of the feedback controller 306.

The feedback controller 306 uses the comparison value e to adjust a value of a controllable variable u that is input to the simulator 304. The behavior of the simulator 304 is modified by adjustment of the controllable variable u. Although just one metric y and one controllable variable u are shown in FIG. 3, it is noted that there can be multiple metrics y and multiple controllable variables u. In fact, in accordance with some embodiments, the control system implemented in the simulation framework provided by the simulation system 300 allows for any one or more of multiple metrics y output by the simulator 304 to be selected for coupling by the feedback controller 306 to any one or more of multiple controllable variables u that can be input to the simulator 304.

The selectivity of the output metrics y and input controllable variables u can be based on selection input 312 stored in a storage media 302, which can be implemented with one or more disk-based storage devices, one or more integrated circuit storage devices, and so forth. The selection input 312 can reflect user selection, or alternatively, the selection input 312 can be in the form of selection criteria. The selection input 312 is provided to the feedback controller 306 to allow the feedback controller 306 to select one or more of the metrics y and controllable variables u to couple according to some embodiments.

Although the comparator 308 is shown outside the feedback controller 306, it is noted that the comparator 308 can be provided inside the feedback controller 306. As used here, the term "feedback controller" is intended to refer to either the feedback controller with the comparator 308, or the feedback controller connected to the comparator 308.

As further shown in FIG. 3, the reservoir model 200 (which is stored in the storage media 302) can include multiple regions (region 1, region 2, and region 3 shown) that correspond to respective portions of a reservoir that can be selected for simulation by the simulator 304. Alternatively, instead of separating the reservoir model 200 into multiple regions, the reservoir model 200 can instead represent the entire reservoir.

The reservoir model 200 also includes controllable flow entities 204. A controllable flow entity refers to any component associated with a reservoir that is able to control fluid flow to or from the reservoir. For example, a controllable flow entity can include a well to inject or produce fluids, a component to inject heat into the reservoir, and so forth.

Examples of the metric y include any one of the following: pressure, temperature, flow rate (at bottom-hole, tubing head, across pipes, across chokes, at surface equipment, etc.), flow volume, phase saturation, and so forth.

Examples of the controllable variable u include any one or more of the following: flow rate at a selected component (downhole or at the surface); pressure at a selected component (downhole or at the surface), a component setting, a constraint on fluid flow, a constraint on temperature, or any other property that affects the behavior of a controllable flow entity as modeled by the reservoir model 200. The constraint (u) output by the feedback controller 306 is set such that the difference between the actual value of the metric y and the target metric value, $y_{sp}$, will be reduced (or minimized).

A feedback controller is a formal control mechanism that aims to bring a process operating condition to a target value by modifying the setting(s) of the process (control variable, u) based on the discrepancy (error e) between the observed process output (y) and the desired target value (the set-point $y_{sp}$). In the context of some embodiments, the "process" is the simulator. The error is simply the difference between the process (simulator) output and the target value:

$$e = y_{sp} - y. \tag{Eq. 1}$$

The generic nature of the feedback controller 306 according to some embodiments allows a flexible system with which the list of observable metrics (y) and controllable variables (u) may be combined in order to evaluate many different control scenarios.

As noted above, the feedback controller 306 can be either a PID controller or a fuzzy logic controller.

A PID controller has the following form in a continuous time domain:

$$u(t) = K_P\left[e(t) + \frac{1}{T_I}\int_0^t e(t)dt + T_D\frac{de(t)}{dt}\right], \tag{Eq. 2}$$

where:

t is time u(t) is the feedback controller output (process input) at time t, e(t) is the observed error ($y_{sp}-y$) at time t, $K_P$ is the proportional gain constant, $T_I$ is the integral time constant, and $T_D$ is the derivative time constant.

Since the process according to some embodiments is a numerical simulator, which is discrete in time, the discrete form of Eq. 2 is:

$$u(k) = K_P\left[e(k) + \frac{1}{T_I}\sum_{i=0}^{k} e(i)\Delta t(i) + T_D\frac{\Delta e(k)}{\Delta t(k)}\right], \tag{Eq. 3}$$

where:

k is the current time-step index, e(i) is the observed error at time-step I, $\Delta e(i)$ is the change in error over the previous time-step $(e(i)-e(i-1))$, and $\Delta t(i)$ is the $i^{th}$ time-step size $(t_i-t_{i-1})$.

It can be seen that PID output is determined by three components (proportional component, integral component, and derivative component), as described in Table 1. Controllers with no derivative component are referred to as PI controllers, and controllers with only the proportional term are referred to as P controllers.

TABLE 1

COMPONENTS CONTRIBUTING TO A PID CONTROLLER OUTPUT

| Term | | Tuning Parameter | Purpose |
|---|---|---|---|
| Proportional | $e(k)$ | $K_P$ | The proportional term makes a change to the output that is proportional to the current error value. Higher proportional gain helps the process output reach the set-point quicker. |
| Integral | $\sum_{i=0}^{k} e(i)\Delta t(i)$ | $K_P/T_I$ | The integral term takes all previous errors and their durations into consideration and accelerates the change of process output towards the set-point. However if the integral term's contribution is too high, it may cause the present process output to overshoot the set-point value. |
| Derivative | $\dfrac{\Delta e(k)}{\Delta t(k)}$ | $K_P \times T_D$ | The derivative term takes the current change in error into consideration and slows the rate of change of the controller output in order to suppress the overshoot that results from the integral term. |

The performance of a PID controller depends on its parameters $K_P$, $T_I$ and $T_D$. Thus, parameter tuning is performed to improve the performance of the control system according to some embodiments. One technique of performing parameter tuning involves using a set of empirical values resulting from a series of tuning experiments, such as that provided by the Ziegler-Nichols technique, as described in K. Åström et al., "PID Controllers: Theory, Design, and Tuning," Instrument Society of America" (1995).

The Ziegler-Nichols technique is carried out as follows:
1. Disable the integral and derivative terms.
2. Perform runs, varying $K_P$, until the observed value (y) starts oscillating with constant amplitude and frequency.
3. Record the value for $K_P$, referred to as $K_U$ (ultimate gain).
4. Record the period length of the oscillation, referred to as $T_U$ (ultimate period).
5. Calculate the Ziegler-Nichols parameters from empirical formulas.

It is often not possible to achieve constant amplitude and frequency, because the process response generally changes with time. However, it is generally sufficient to use an averaged period length when oscillations are observed.

In those cases where the derivative term's value as given by the Ziegler-Nichols technique is too high, which can result in oscillatory behavior, the derivative term's value is decreased by 1 or even 2 orders of magnitude. In this way, stable behavior can be recovered while preserving the benefit from the derivative term's action in terms of sharper convergence to the set-point.

Figure 4:
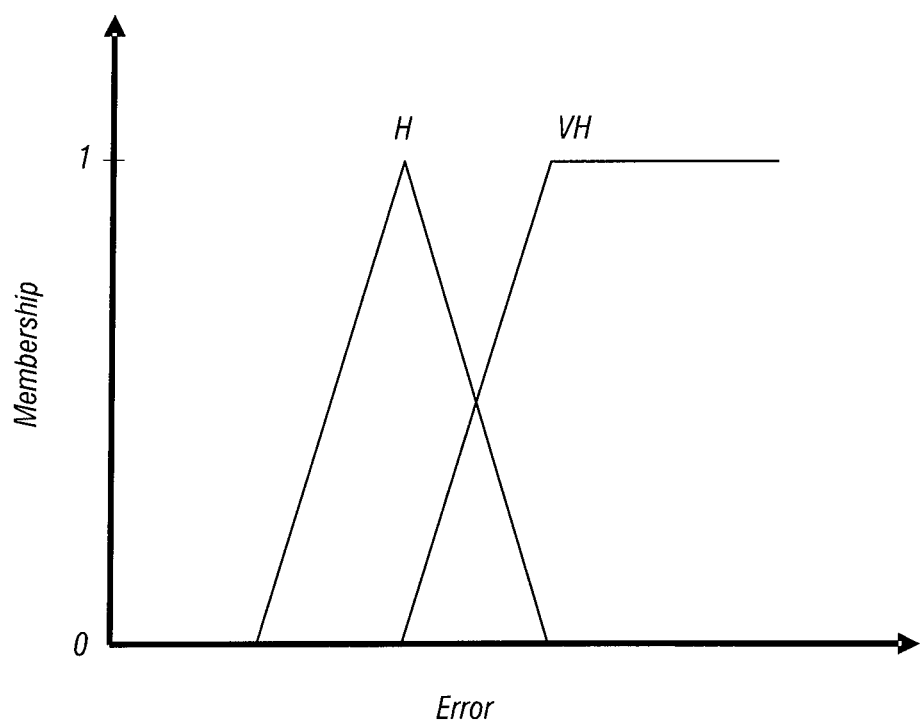
FIG. 4 depicts triangular (H) and trapezoidal (VH) fuzzy set membership functions to illustrate a fuzzy logic feedback controller according to an embodiment.

Fuzzy logic feedback controllers represent a different approach to control problems as compared to PID controllers. Fuzzy logic feedback controllers are based on the foundations of fuzzy logic. Fuzzy logic is designed to quantitatively represent qualitative expert knowledge about a process. In traditional set theory, an element is either in, or out, of a defined set. In other words, the membership value of an element for a traditional set is either 1 or 0. For instance, considering the error (e) which is the difference in the target value ($y_{sp}$) and the actual value (y) of a metric (e.g., average pressure) in a reservoir region, a particular error value is either in the set of high error values, or it is out. However, in the context of analyzing a reservoir, the sets of pressure (or other metric) errors is not discrete. There are different degrees of high and low errors in the context of reservoir analysis. Fuzzy sets aim to capture this by defining fuzzy set membership functions, whose membership may be defined by a continuous number between 0 and 1. Examples of fuzzy set membership functions are illustrated in FIG. 4. FIG. 4 illustrates triangular (H) and trapezoidal (VH) fuzzy set membership functions. Other possible types of fuzzy set membership functions include Gaussian, bell-shaped and singletons.

Similarly, in the context of reservoir analysis, the appropriate response to high pressure errors is also not discrete. There are a range of responses that should be considered, depending on the range of observations that are made. Hence, similar to fuzzy set membership functions as in FIG. 4, there would be fuzzy sets to capture the response (e.g., a high choke setting or a low choke setting).

The relations between input and output fuzzy sets are set up through fuzzy rules. These rules aim to capture an expected response given the outcome of an observation, for instance:

If Error is High then Choke Setting is High.

This constitutes a fuzzy rule. There would be similar rules for other fuzzy sets of error values (e.g. low, very low, etc.). There could also be additional fuzzy sets that correspond to other observations (e.g., the accumulation of errors).

Once the input/output fuzzy membership functions and fuzzy rules are determined, the fuzzy logic feedback controller setup is complete. Given inputs, a fuzzy logic controller processes the inputs to come up with membership values of its output. This process is called fuzzy inference (e.g., fuzzy inference using a max-min technique).

After fuzzy inference has been completed, the fuzzy logic feedback controller has to generate a real number that would be the value for the controllable variable (u) to the simulator. One technique for obtaining this real number is called defuzzification, since it involves converting (defuzzifying) fuzzy set memberships into a real value. There are many different ways to carry out defuzzification. A center average technique for defuzzification can be used in some implementations. For the center average technique, the fuzzy logic feedback controller output is given by:

$$u = \frac{\sum_{i=1}^{n_s} h_i u_i}{\sum_{i=1}^{n_s} h_i}, \quad \text{(Eq. 4)}$$

where:

$h_i$ is the membership level of a particular fuzzy set resulting from a particular input, $u_i$ is the output value corresponding to input $h_i$ that results from a fuzzy rule, and $n_s$ is the number of active input fuzzy sets.

Thus, it is apparent that fuzzy sets tied together with fuzzy rules may be used to control a process (simulator 304 in FIG. 3). In some cases, if constructed appropriately, the response of the fuzzy logic feedback controller will be similar to a PID controller. In fact, it is possible to come up with a fuzzy logic feedback controller that has three inputs (P, I and D), and a single output, and one which performs exactly the same as the PID controller.

Figure 5:
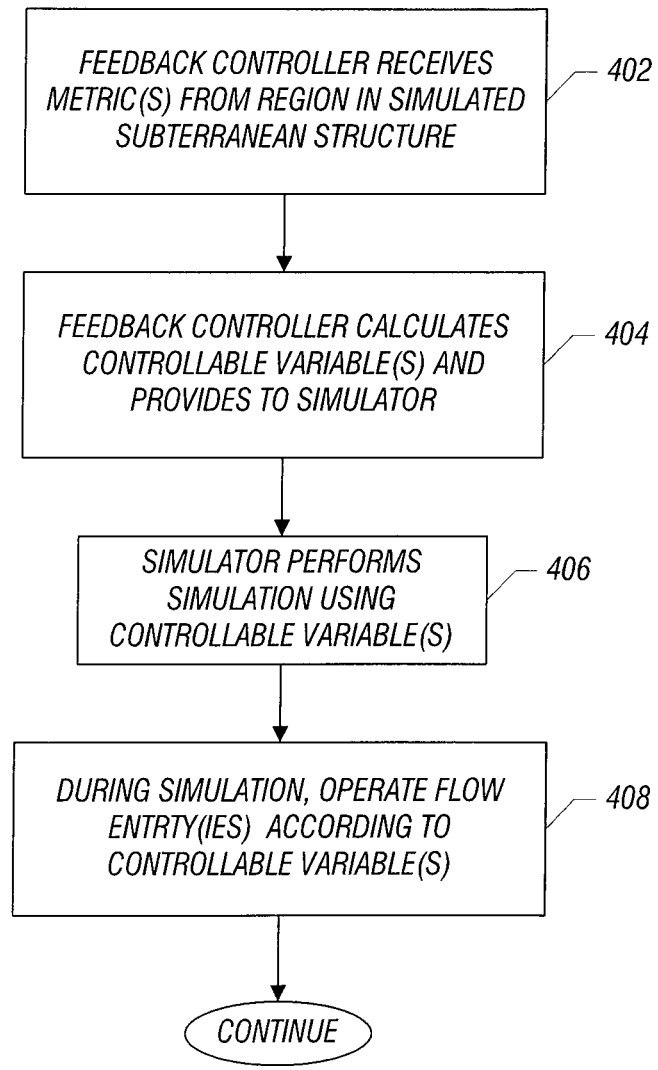
FIG. 5 is a flow diagram of a process of feedback control in a simulation framework, according to an embodiment.

FIG. 5 illustrates a process performed by a control system that employs a feedback controller and a simulator of a subterranean structure. The feedback controller (306 shown in FIG. 3) receives (at 402) one or more observable metrics from the simulator 304 during simulation of a subterranean structure (e.g., reservoir) using a model of the subterranean structure. The one or more observable metrics can be associated with a particular region (from among multiple regions) of the simulated subterranean structure. Alternatively, the one or more observable metrics can be associated with the entirety of the simulated subterranean structure. Examples of observable metrics include pressure, temperature, flow rate, flow volume, phase saturation, and so forth. For a particular region, the observable metric can be an average value of multiple values of the metric across the region.

The feedback controller 306 then calculates (at 404) one or more controllable variables that are input to the simulator 304 to control settings associated with the simulator 304. Controllable variables can include one or more of the following: flow rate at a selected component; pressure at a selected component, a component setting, a constraint on fluid flow, a constraint on temperature, or any other property that affects the behavior of a controllable flow entity as modeled by the model of the subterranean structure.

The controllable variable(s) is (are) provided (at 406) from the feedback controller 306 to the simulator 304. The controllable variable(s) causes settings of the model to change, including settings of controllable flow entities. Examples of controllable flow entities include one or more of the following: a well to inject or produce fluids, a component to inject heat into the reservoir, and so forth.

During simulation, the controllable flow entity(ies) of the model is (are) operated (at 408) according to the controllable variable(s) set by the feedback controller 306.

The procedure of FIG. 5 can be iteratively performed multiple times at discrete time steps. The time-step size should be a fraction of the response delay of the simulator output to a given change in the simulator input (feedback controller output). If the time-step size is too large, the feedback controller will not be stable since it will not be able to correctly capture simulator input/output dynamics.

Figure 6:
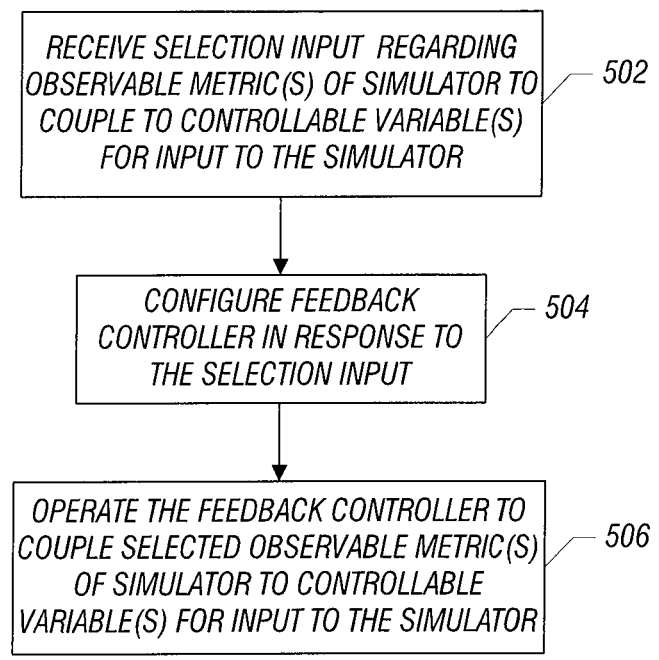
FIG. 6 is a flow diagram of configuring a feedback controller according to an embodiment.

FIG. 6 is a flow diagram of a procedure to configure a feedback controller according to an embodiment. A selection input 312 (FIG. 3) is received (at 502), where the selection input 312 is regarding observable metric(s) of the simulator 304 to couple to controllable variable(s) input to the simulator 304. The selection input 312 can be based on user selection, such as user selection received through a graphical user interface (GUI) or in a file. Alternatively, the selection input 312 can be in the form of selection criteria.

The feedback controller 306 is configured (at 504) according to the selection input 312. The configured feedback controller 306 couples the selected observable metric(s) to the selected control variable(s). The feedback controller 306 is then operated (at 506) according to the selected configuration, where the feedback controller 306 adjusts the selected control variable(s) according to values of the selected observable metric(s) output by the simulator 304.

Some example use cases are noted below. In one example, the control system including the feedback controller and simulator is useful in the simulation of reservoir management strategies involving pressure maintenance. In pressure maintenance strategies, average pressure could be maintained by controlling the choke settings in a surface network model coupled to the reservoir simulator.

The control variable for this example (which is manipulated by the feedback controller 306) can be the production rate at the well, where one of the following production rates can be selected for use: oil, water, or gas rates. The simulator output metric that can be selected to couple to the control variable can be the average water saturation within a region of the simulated reservoir. The set-point for the feedback controller 306 is the target value for the simulator output metric, in this case the target average water saturation. Another possible input includes tuning parameters of the feedback controller 306 (PID controller), such as tuning parameters obtained according to the Ziegler-Nichols technique discussed above.

As another example, the feedback controller 306 can be used to control the average temperature (simulator output metric) within a region of a simulated reservoir. The control variable input to the simulator 304 that can be adjusted by the feedback controller 306 in this case can be the steam injection rate such that a constant average temperature can be maintained.

By using the control system including the feedback controller and simulator according to some embodiments, sophisticated control mechanisms can be implemented. Also, as new equipment becomes available in the field (e.g., sensors or unmanned mechanical devices), using a feedback controller within a numerical simulation can provide a way of assessing the economical feasibility of installing such new equipment into existing facilities.

The processes depicted in FIGS. 5 and 6 can be performed by software, hardware, firmware, various logic, and so forth (or any combination thereof).

Instructions of software described above (including the feedback controller 306 and simulator 304 of FIG. 3) are loaded for execution on a processor (such as processor 310 in FIG. 3). The processor includes microprocessors, microcontrollers, processor modules or subsystems (including one or more microprocessors or microcontrollers), or other control or computing devices. A "processor" can refer to a single component or to plural components (e.g., one CPU or multiple CPUs in one computer or multiple computers).

Data and instructions (of the software) are stored in respective storage devices, which are implemented as one or more computer-readable or computer-usable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

While some embodiments have been disclosed, those skilled in the art, having the benefit of this disclosure, will appreciate numerous modifications and variations therefrom. It is intended that the appended claims cover such modifications and variations.

What is claimed is:

1. A method of feedback control in a simulation framework, comprising:
selecting any one of plural output metrics from a simulator of a subterranean structure;
receiving a value for the selected output metric from the simulator; and
in response to the received value of the selected output metric and a target value of the selected output metric, adjusting at least one setting of the simulator by a feedback controller executed on a processor wherein adjusting the at least one setting of the simulator by the feedback controller comprises adjusting the at least one setting of the simulator by a Proportional Integral Derivative (PID) feedback controller that comprises an integral feedback control, wherein the integral feedback control operates according to a time-step size that comprises a fraction of a response delay of the simulator for the selected output metric to a given change to the at least one setting of the simulator by the feedback controller.

2. The method of claim 1, wherein the adjusted at least one setting comprises a controllable variable that is provided as an input to the simulator, wherein the simulator is associated with multiple controllable variables, wherein a simulation of the subterranean structure performed by the simulator is based on values of the controllable variables, the method further comprising:
selectively coupling any one or more of the plural output metrics from the simulator to any one or more of the controllable variables.

3. The method of claim 2, wherein coupling of the selected one or more output metrics to the selected one or more controllable variables causes the feedback controller to adjust the selected one or more controllable variables in response to the selected one or more output metrics.

4. The method of claim 1, wherein the adjusted at least one setting comprises a controllable variable that is provided as an input to the simulator, and wherein the controllable variable comprises a variable that affects a behavior of a controllable flow entity modeled by a model of the subterranean structure.

5. The method of claim 1, wherein the output metrics are selected from among pressure, temperature, flow rate, flow volume, and phase saturation.

6. A system comprising:
a processor;
a simulator executable on the processor to simulate a subterranean structure using a model, the simulator to produce output metrics when performing a simulation, and wherein the simulator has input control variables that control the simulator; and
a feedback controller executable on the processor to configurably couple any of plural ones of the output metrics to any of plural ones of the input control variables, wherein the feedback controller is to adjust a particular one of the input control variables in response to particular one or more output metrics that have been coupled to the particular one of the input control variables to minimize error of one or more output metric values for the particular one or more output metrics with respect to one or more corresponding target values for the particular one or more output metrics, wherein the feedback controller comprises a Proportional Integral Derivative (PID) feedback controller that comprises an integral feedback control, wherein the integral feedback control operates according to a time-step size that comprises a fraction of a response delay of the simulator for the particular one or more output metrics to a given change to the particular one of the input control variables by the feedback controller.

7. The system of claim 6, wherein the model models at least one controllable flow entity associated with the subterranean structure, wherein the input control variables are to control the at least one controllable flow entity.

8. The system of claim 6, wherein the model comprises a reservoir model.

9. The system of claim 6, wherein the output metrics are selected from among pressure, temperature, flow rate, flow volume, and phase saturation.

10. An article comprising at least one computer-readable non-transitory storage medium containing instructions that upon execution by a processor is to:
receive input regarding configuration of a feedback controller that is coupled to a simulator of a subterranean structure, wherein the received input specifies a particular one of plural output metrics from the simulator to couple to a particular one of control variables input to the simulator wherein the feedback controller comprises a Proportional Integral Derivative (PID) feedback controller that comprises an integral feedback control;
configure the feedback controller according to the received input; and
operate the feedback controller to couple the particular output metric to the particular control variable, wherein the feedback controller receives values of the particular output metric from the simulator and adjusts the particular control variable in response to the received values of the particular output metric to minimize error with respect to a target value for the particular output metric, and wherein the integral feedback control operates according to a time-step size that comprises a fraction of a response delay of the simulator for the particular output metric to a given change to the particular control variable by the feedback controller.

11. The article of claim 10, wherein adjustment of the particular control variable modifies an operation of the simulator.

12. The article of claim 10, wherein the simulator uses a model of the subterranean structure to perform a simulation, and wherein adjustment of the particular control variable adjusts an aspect of the model.

13. The article of claim 12, wherein adjustment of the particular control variable adjusts a setting of a controllable flow entity modeled by the model.

14. The article of claim 10, wherein the received input specifies that one or more of the plural output metrics from the simulator are coupled to one or more of the control variables input to the simulator.

15. The article of claim 10, wherein receiving the input regarding configuration of the feedback controller comprises receiving the input based on user selection.

* * * * *